United States Patent
Park et al.

(10) Patent No.: US 11,907,479 B2
(45) Date of Patent: Feb. 20, 2024

(54) ELECTRONIC DEVICE AND METHOD FOR OPERATING PROXIMITY SENSOR INCLUDED IN ELECTRONIC DEVICE

(71) Applicant: Samsung Electronics Co., Ltd., Suwon-si (KR)

(72) Inventors: Hyeongsoon Park, Suwon-si (KR); Jeonggyu Jo, Suwon-si (KR); Hyunwoo Sim, Suwon-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 0 days.

(21) Appl. No.: 17/961,111

(22) Filed: Oct. 6, 2022

(65) Prior Publication Data

US 2023/0057721 A1    Feb. 23, 2023

Related U.S. Application Data

(63) Continuation of application No. PCT/KR2021/004218, filed on Apr. 5, 2021.

(30) Foreign Application Priority Data

Apr. 8, 2020 (KR) .................... 10-2020-0042914

(51) Int. Cl.
  *G06F 3/042* (2006.01)
  *G06F 3/041* (2006.01)
  *H01L 29/786* (2006.01)

(52) U.S. Cl.
  CPC .......... *G06F 3/0421* (2013.01); *G06F 3/0412* (2013.01); *H01L 29/78603* (2013.01)

(58) Field of Classification Search
  CPC . G06F 3/0412; G06F 3/0421; H01L 29/78603
  See application file for complete search history.

(56) References Cited

U.S. PATENT DOCUMENTS

| | | | |
|---|---|---|---|
| 9,064,451 B2 * | 6/2015 | Lynch | .................. G09G 3/3208 |
| 9,679,513 B2 * | 6/2017 | Lynch | .................. G09G 3/3208 |
| 10,056,029 B2 * | 8/2018 | Lynch | ................... G06F 3/0412 |
| 10,381,485 B2 * | 8/2019 | Kang | ............... G02F 1/133555 |
| 10,707,351 B2 * | 7/2020 | Kang | .................. H01L 27/1248 |
| 10,713,998 B2 * | 7/2020 | Lynch | .................. G06F 3/0421 |
| 10,739,893 B2 * | 8/2020 | Park | ......................... G06F 3/14 |
| 10,852,866 B2 * | 12/2020 | Park | ..................... G06F 1/3231 |
| 2009/0315848 A1 | 12/2009 | Ku et al. | |
| 2010/0231528 A1 | 9/2010 | Wolfe et al. | |

(Continued)

FOREIGN PATENT DOCUMENTS

| KR | 10-2010-0001601 A | 1/2010 |
|---|---|---|
| KR | 10-2018-0050473 A | 5/2018 |

(Continued)

*Primary Examiner* — Michael Pervan
(74) *Attorney, Agent, or Firm* — Jefferson IP Law, LLP (57) ABSTRACT

An electronic device is provided. The electronic device includes a display including a plurality of thin film transistors (TFTs), a proximity sensor disposed under the display and including a plurality of light emitting units, and at least one processor operatively coupled to the display and the proximity sensor. The light generated from the proximity sensor may have a lower energy than the work function of silicon included in the plurality of TFTs of the display.

14 Claims, 7 Drawing Sheets

(56) References Cited

U.S. PATENT DOCUMENTS

| | | |
|---|---|---|
| 2011/0096033 A1 | 4/2011 | Ko |
| 2013/0194199 A1* | 8/2013 | Lynch .................. G06F 3/0421 |
| | | 445/24 |
| 2015/0287358 A1* | 10/2015 | Lynch .................. G09G 3/3208 |
| | | 345/83 |
| 2017/0287392 A1 | 10/2017 | Lynch et al. |
| 2018/0129328 A1 | 5/2018 | Park et al. |
| 2018/0196931 A1 | 7/2018 | Cho et al. |
| 2018/0212060 A1 | 7/2018 | Kang et al. |
| 2018/0357954 A1* | 12/2018 | Lynch .................. G09G 3/3208 |
| 2019/0196635 A1* | 6/2019 | Park ........................ G06F 3/14 |
| 2019/0319133 A1* | 10/2019 | Kang .................... H01L 31/101 |
| 2020/0279952 A1* | 9/2020 | Kang .................... H01L 31/101 |
| 2020/0320926 A1* | 10/2020 | Lynch .................. G06F 3/0412 |
| 2020/0342810 A1 | 10/2020 | Hier et al. |
| 2020/0363894 A1* | 11/2020 | Park ...................... G01S 7/4816 |

FOREIGN PATENT DOCUMENTS

| | | |
|---|---|---|
| KR | 10-2018-0081320 A | 7/2018 |
| KR | 10-2018-0088099 A | 8/2018 |
| KR | 10-2019-0088800 A | 7/2019 |

* cited by examiner

ELECTRONIC DEVICE AND METHOD FOR OPERATING PROXIMITY SENSOR INCLUDED IN ELECTRONIC DEVICE

CROSS-REFERENCE TO RELATED APPLICATION(S)

This application is a continuation application, claiming priority under § 365(c), of an International application No. PCT/KR2021/004218, filed on Apr. 5, 2021, which is based on and claims the benefit of a Korean patent application number 10-2020-0042914, filed on Apr. 8, 2020, in the Korean Intellectual Property Office, the disclosure of which is incorporated by reference herein in its entirety.

BACKGROUND

1. Field

The disclosure relates to an electronic device and a method for operating a proximity sensor included in an electronic device.

2. Description of Related Art

Various types of sensor devices are mounted in an electronic device so that the electronic device operates through recognition of an external environment condition and a change thereof.

Such various sensor devices include a proximity sensor which generates light, receives light reflected by a subject, and then generates a sensor signal by using the received light. A proximity sensor that generates light may be usually disposed on the front surface of an electronic device.

Recently, according to an increase of the area occupied by a front display in an electronic device, a space for a proximity sensor that generates light has been reduced.

The above information is presented as background information only to assist with an understanding of the disclosure. No determination has been made, and no assertion is made, as to whether any of the above might be applicable as prior art with regard to the disclosure.

SUMMARY

Due to an increase of display area, proximity sensors that generate light are disposed under the display.

In some cases, light generated by a proximity sensor may affect an operation of a thin film transistor (TFT) included in a display.

Therefore, the display may perform an unintended operation in a part facing the proximity sensor. For example, the display may emit light in a part facing the proximity sensor.

Aspects of the disclosure are to address at least the above-mentioned problems and/or disadvantages and to provide at least the advantages described below. Accordingly, an aspect of the disclosure is to provide an electronic device capable of solving a display malfunction problem caused by light generated by a proximity sensor, and a method for operating a proximity sensor.

Additional aspects will be set forth in part in the description which follows and, in part, will be apparent from the description, or may be learned by practice of the presented embodiments.

In accordance with an aspect of the disclosure, an electronic device is provided. The electronic device includes a display including multiple TFTs, a proximity sensor disposed under the display and including multiple light emitters, and at least one processor operatively connected to the display and the proximity sensor, wherein light generated by the proximity sensor may have an energy lower than a work function of silicon included in the multiple TFTs of the display.

In accordance with another aspect of the disclosure, a method for operating a proximity sensor included in an electronic device is provided. The method includes disposing the proximity sensor under a display of the electronic device, and where the proximity sensor includes multiple light emitters, and operating the multiple light emitters of the proximity sensor in a state where at least a partial area of the display, which faces the proximity sensor, is turned off.

According to various embodiments disclosed herein, a display malfunction problem caused by light generated by a proximity sensor may be solved.

Other aspects, advantages, and salient features of the disclosure will become apparent to those skilled in the art from the following detailed description, which, taken in conjunction with the annexed drawings, discloses various embodiments of the disclosure.

BRIEF DESCRIPTION OF THE DRAWINGS

The above and other aspects, features, and advantages of certain embodiments of the disclosure will be more apparent from the following description taken in conjunction with the accompanying drawings, in which.

Throughout the drawings, it should be noted that like reference numbers are used to depict the same or similar elements, features, and structures.

DETAILED DESCRIPTION

The following description with reference to the accompanying drawings is provided to assist in a comprehensive understanding of various embodiments of the disclosure as defined by the claims and their equivalents. It includes various specific details to assist in that understanding but these are to be regarded as merely exemplary. Accordingly, those of ordinary skill in the art will recognize that various changes and modifications of the various embodiments described herein can be made without departing from the scope and spirit of the disclosure. In addition, descriptions of well-known functions and constructions may be omitted for clarity and conciseness.

The terms and words used in the following description and claims are not limited to the bibliographical meanings, but, are merely used by the inventor to enable a clear and consistent understanding of the disclosure. Accordingly, it should be apparent to those skilled in the art that the following description of various embodiments of the disclosure is provided for illustration purpose only and not for the purpose of limiting the disclosure as defined by the appended claims and their equivalents.

It is to be understood that the singular forms "a," "an," and "the" include plural referents unless the context clearly dictates otherwise. Thus, for example, reference to "a component surface" includes reference to one or more of such surfaces.

With regard to the description of the drawings, similar reference numerals may be used to designate similar or relevant elements.

As used herein, each of such phrases as "A or B," "at least one of A and B," "at least one of A or B," "A, B, or C," "at least one of A, B, and C," and "at least one of A, B, or C" may include all possible combinations of the items enumerated together in a corresponding one of the phrases. As used herein, such terms as "a first", "a second", "the first", and "the second" may be used to simply distinguish a corresponding element from another, and does not limit the elements in other aspect (e.g., importance or order). It is to be understood that if an element (e.g., a first element) is referred to, with or without the term "operatively" or "communicatively", as "coupled with/to" or "connected with/to" another element (e.g., a second element), it means that the element may be coupled/connected with/to the other element directly (e.g., wiredly), wirelessly, or via a third element.

Figure 1:
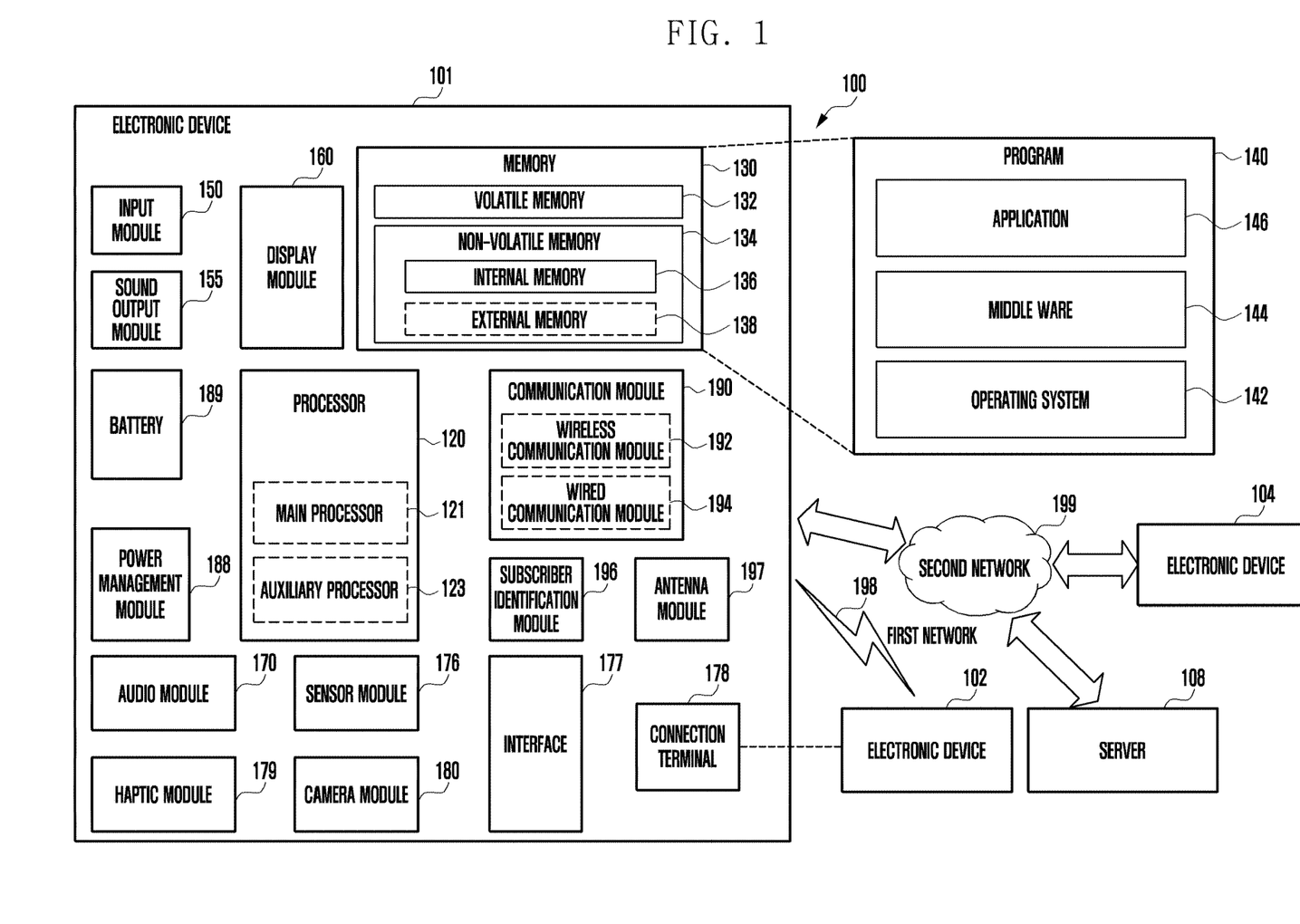
FIG. 1 is a block diagram of an electronic device in a network environment according to an embodiment of the disclosure.

FIG. 1 is a block diagram illustrating an electronic device in a network environment according to an embodiment of the disclosure.

Referring to FIG. 1, an electronic device 101 in a network environment 100 may communicate with an external electronic device 102 via a first network 198 (e.g., a short-range wireless communication network), or at least one of an external electronic device 104 or a server 108 via a second network 199 (e.g., a long-range wireless communication network). According to an embodiment of the disclosure, the electronic device 101 may communicate with the external electronic device 104 via the server 108. According to an embodiment of the disclosure, the electronic device 101 may include a processor 120, a memory 130, an input module 150, a sound output module 155, a display module 160, an audio module 170, a sensor module 176, an interface 177, a connecting terminal 178, a haptic module 179, a camera module 180, a power management module 188, a battery 189, a communication module 190, a subscriber identification module (SIM) 196, or an antenna module 197. In some embodiments of the disclosure, at least one of the components (e.g., the connecting terminal 178) may be omitted from the electronic device 101, or one or more other components may be added in the electronic device 101. In some embodiments of the disclosure, some of the components (e.g., the sensor module 176, the camera module 180, or the antenna module 197) may be implemented as a single component (e.g., the display module 160).

The processor 120 may execute, for example, software (e.g., a program 140) to control at least one other component (e.g., a hardware or software component) of the electronic device 101 coupled with the processor 120, and may perform various data processing or computation. According to one embodiment of the disclosure, as at least part of the data processing or computation, the processor 120 may store a command or data received from another component (e.g., the sensor module 176 or the communication module 190) in a volatile memory 132, process the command or the data stored in the volatile memory 132, and store resulting data in a non-volatile memory 134. According to an embodiment of the disclosure, the processor 120 may include a main processor 121 (e.g., a central processing unit (CPU) or an application processor (AP)), or an auxiliary processor 123 (e.g., a graphics processing unit (GPU), a neural processing unit (NPU), an image signal processor (ISP), a sensor hub processor, or a communication processor (CP)) that is operable independently from, or in conjunction with, the main processor 121. For example, when the electronic device 101 includes the main processor 121 and the auxiliary processor 123, the auxiliary processor 123 may be adapted to consume less power than the main processor 121, or to be specific to a specified function. The auxiliary processor 123 may be implemented as separate from, or as part of the main processor 121.

The auxiliary processor 123 may control at least some of functions or states related to at least one component (e.g., the display 1 module 160, the sensor module 176, or the communication module 190) among the components of the electronic device 101, instead of the main processor 121 while the main processor 121 is in an inactive (e.g., sleep) state, or together with the main processor 121 while the main processor 121 is in an active state (e.g., executing an application). According to an embodiment of the disclosure, the auxiliary processor 123 (e.g., an image signal processor or a communication processor) may be implemented as part of another component (e.g., the camera module 180 or the communication module 190) functionally related to the auxiliary processor 123. According to an embodiment of the disclosure, the auxiliary processor 123 (e.g., the neural processing unit) may include a hardware structure specified for artificial intelligence model processing. An artificial intelligence model may be generated by machine learning. Such learning may be performed, e.g., by the electronic device 101 where the artificial intelligence is performed or via a separate server (e.g., the server 108). Learning algorithms may include, but are not limited to, e.g., supervised learning, unsupervised learning, semi-supervised learning, or reinforcement learning. The artificial intelligence model may include a plurality of artificial neural network layers. The artificial neural network may be a deep neural network (DNN), a convolutional neural network (CNN), a recurrent neural network (RNN), a restricted boltzmann machine (RBM), a deep belief network (DBN), a bidirectional recurrent deep neural network (BRDNN), deep Q-network or a combination of two or more thereof but is not limited thereto. The artificial intelligence model may, additionally or alternatively, include a software structure other than the hardware structure.

The memory 130 may store various data used by at least one component (e.g., the processor 120 or the sensor module 176) of the electronic device 101. The various data may include, for example, software (e.g., the program 140) and input data or output data for a command related thereto. The memory 130 may include the volatile memory 132 or the non-volatile memory 134. The non-volatile memory 134 includes an internal memory 136 and an external memory 138.

The program 140 may be stored in the memory 130 as software, and may include, for example, an operating system (OS) 142, middleware 144, or an application 146.

The input module 150 may receive a command or data to be used by another component (e.g., the processor 120) of the electronic device 101, from the outside (e.g., a user) of the electronic device 101. The input module 150 may include, for example, a microphone, a mouse, a keyboard, a key (e.g., a button), or a digital pen (e.g., a stylus pen).

The sound output module 155 may output sound signals to the outside of the electronic device 101. The sound output module 155 may include, for example, a speaker or a receiver. The speaker may be used for general purposes, such as playing multimedia or playing record. The receiver may be used for receiving incoming calls. According to an embodiment of the disclosure, the receiver may be implemented as separate from, or as part of the speaker.

The display module 160 may visually provide information to the outside (e.g., a user) of the electronic device 101. The display module 160 may include, for example, a display, a hologram device, or a projector and control circuitry to control a corresponding one of the display, hologram device, and projector. According to an embodiment of the disclosure, the display module 160 may include a touch sensor adapted to detect a touch, or a pressure sensor adapted to measure the intensity of force incurred by the touch.

The audio module 170 may convert a sound into an electrical signal and vice versa. According to an embodiment of the disclosure, the audio module 170 may obtain the sound via the input module 150, or output the sound via the sound output module 155 or a headphone of an external electronic device (e.g., the external electronic device 102) directly (e.g., wiredly) or wirelessly coupled with the electronic device 101.

The sensor module 176 may detect an operational state (e.g., power or temperature) of the electronic device 101 or an environmental state (e.g., a state of a user) external to the electronic device 101, and then generate an electrical signal or data value corresponding to the detected state. According to an embodiment of the disclosure, the sensor module 176 may include, for example, a gesture sensor, a gyro sensor, an atmospheric pressure sensor, a magnetic sensor, an acceleration sensor, a grip sensor, a proximity sensor, a color sensor, an infrared (IR) sensor, a biometric sensor, a temperature sensor, a humidity sensor, or an illuminance sensor.

The interface 177 may support one or more specified protocols to be used for the electronic device 101 to be coupled with the external electronic device (e.g., the external electronic device 102) directly (e.g., wiredly) or wirelessly. According to an embodiment of the disclosure, the interface 177 may include, for example, a high definition multimedia interface (HDMI), a universal serial bus (USB) interface, a secure digital (SD) card interface, or an audio interface.

A connecting terminal 178 may include a connector via which the electronic device 101 may be physically connected with the external electronic device (e.g., the external electronic device 102). According to an embodiment of the disclosure, the connecting terminal 178 may include, for example, a HDMI connector, a USB connector, an SD card connector, or an audio connector (e.g., a headphone connector).

The haptic module 179 may convert an electrical signal into a mechanical stimulus (e.g., a vibration or a movement) or electrical stimulus which may be recognized by a user via his tactile sensation or kinesthetic sensation. According to an embodiment of the disclosure, the haptic module 179 may include, for example, a motor, a piezoelectric element, or an electric stimulator.

The camera module 180 may capture a still image or moving images. According to an embodiment of the disclosure, the camera module 180 may include one or more lenses, image sensors, image signal processors, or flashes.

The power management module 188 may manage power supplied to the electronic device 101. According to one embodiment of the disclosure, the power management module 188 may be implemented as at least part of, for example, a power management integrated circuit (PMIC).

The battery 189 may supply power to at least one component of the electronic device 101. According to an embodiment of the disclosure, the battery 189 may include, for example, a primary cell which is not rechargeable, a secondary cell which is rechargeable, or a fuel cell.

The communication module 190 may support establishing a direct (e.g., wired) communication channel or a wireless communication channel between the electronic device 101 and the external electronic device (e.g., the external electronic device 102, the external electronic device 104, or the server 108) and performing communication via the established communication channel. The communication module 190 may include one or more communication processors that are operable independently from the processor 120 (e.g., the application processor (AP)) and supports a direct (e.g., wired) communication or a wireless communication. According to an embodiment of the disclosure, the communication module 190 may include a wireless communication module 192 (e.g., a cellular communication module, a short-range wireless communication module, or a global navigation satellite system (GNSS) communication module) or a wired communication module 194 (e.g., a local area network (LAN) communication module or a power line communication (PLC) module). A corresponding one of these communication modules may communicate with the external electronic device via the first network 198 (e.g., a short-range communication network, such as Bluetooth™, wireless-fidelity (Wi-Fi) direct, or infrared data association (IrDA)) or the second network 199 (e.g., a long-range communication network, such as a legacy cellular network, a 5th generation (5G) network, a next-generation communication network, the Internet, or a computer network (e.g., LAN or wide area network (WAN)). These various types of communication modules may be implemented as a single component (e.g., a single chip), or may be implemented as multi components (e.g., multi chips) separate from each other. The wireless communication module 192 may identify and authenticate the electronic device 101 in a communication network, such as the first network 198 or the second network 199, using subscriber information (e.g., international mobile subscriber identity (IMSI)) stored in the subscriber identification module 196.

The wireless communication module 192 may support a 5G network, after a $4^{th}$ generation (4G) network, and next-generation communication technology, e.g., new radio (NR) access technology. The NR access technology may support enhanced mobile broadband (eMBB), massive machine type communications (mMTC), or ultra-reliable and low-latency communications (URLLC). The wireless communication module 192 may support a high-frequency band (e.g., the millimeter wave (mmWave) band) to achieve, e.g., a high data transmission rate. The wireless communication module 192 may support various technologies for securing performance on a high-frequency band, such as, e.g., beamforming, massive multiple-input and multiple-output (massive MIMO), full dimensional MIMO (FD-MIMO), array antenna, analog beam-forming, or large scale antenna. The wireless communication module 192 may support various requirements specified in the electronic device 101, an external electronic device (e.g., the external electronic device 104), or a network system (e.g., the second network 199). According to an embodiment of the disclosure, the wireless communication module 192 may support a peak data rate (e.g., 20 Gbps or more) for implementing eMBB, loss coverage (e.g., 164 dB or less) for implementing mMTC, or U-plane latency (e.g., 0.5 ms or less for each of downlink (DL) and uplink (UL), or a round trip of 1 ms or less) for implementing URLLC.

The antenna module 197 may transmit or receive a signal or power to or from the outside (e.g., the external electronic device) of the electronic device 101. According to an embodiment of the disclosure, the antenna module 197 may include an antenna including a radiating element composed of a conductive material or a conductive pattern formed in or on a substrate (e.g., a printed circuit board (PCB)). According to an embodiment of the disclosure, the antenna module 197 may include a plurality of antennas (e.g., array antennas). In such a case, at least one antenna appropriate for a communication scheme used in the communication network, such as the first network 198 or the second network 199, may be selected, for example, by the communication module 190 (e.g., the wireless communication module 192) from the plurality of antennas. The signal or the power may then be transmitted or received between the communication module 190 and the external electronic device via the selected at least one antenna. According to an embodiment of the disclosure, another component (e.g., a radio frequency integrated circuit (RFIC)) other than the radiating element may be additionally formed as part of the antenna module 197.

According to various embodiments of the disclosure, the antenna module 197 may form a mmWave antenna module. According to an embodiment of the disclosure, the mmWave antenna module may include a printed circuit board, a RFIC disposed on a first surface (e.g., the bottom surface) of the printed circuit board, or adjacent to the first surface and capable of supporting a designated high-frequency band (e.g., the mmWave band), and a plurality of antennas (e.g., array antennas) disposed on a second surface (e.g., the top or a side surface) of the printed circuit board, or adjacent to the second surface and capable of transmitting or receiving signals of the designated high-frequency band.

At least some of the above-described components may be coupled mutually and communicate signals (e.g., commands or data) therebetween via an inter-peripheral communication scheme (e.g., a bus, general purpose input and output (GPIO), serial peripheral interface (SPI), or mobile industry processor interface (MIPI)).

According to an embodiment of the disclosure, commands or data may be transmitted or received between the electronic device 101 and the external electronic device 104 via the server 108 coupled with the second network 199. Each of the external electronic devices 102 or 104 may be a device of a same type as, or a different type, from the electronic device 101. According to an embodiment of the disclosure, all or some of operations to be executed at the electronic device 101 may be executed at one or more of the external electronic devices 102, 104, or 108. For example, if the electronic device 101 should perform a function or a service automatically, or in response to a request from a user or another device, the electronic device 101, instead of, or in addition to, executing the function or the service, may request the one or more external electronic devices to perform at least part of the function or the service. The one or more external electronic devices receiving the request may perform the at least part of the function or the service requested, or an additional function or an additional service related to the request, and transfer an outcome of the performing to the electronic device 101. The electronic device 101 may provide the outcome, with or without further processing the outcome, as at least part of a reply to the request. To that end, a cloud computing, distributed computing, mobile edge computing (MEC), or client-server computing technology may be used, for example.

Figure 2:
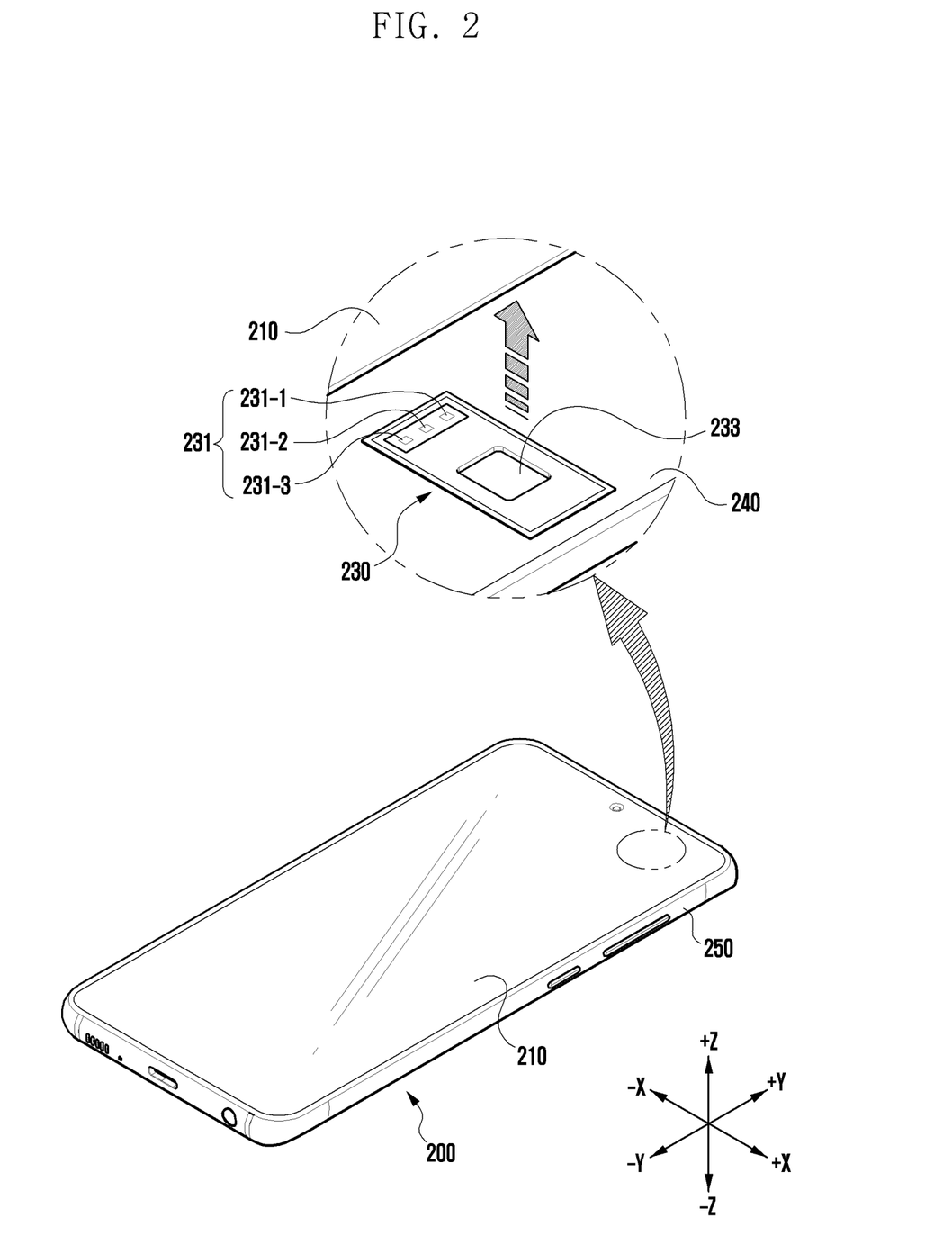
FIG. 2 is a perspective view of an electronic device and a diagram of a proximity sensor included in the electronic device according to an embodiment of the disclosure.

FIG. 2 is a perspective view of an electronic device and a diagram of a proximity sensor included in the electronic device according to an embodiment of the disclosure.

Referring to FIG. 2, according to various embodiments of the disclosure, an electronic device 200 illustrated in FIG. 2 may be one type of the electronic device 101 described with reference to FIG. 1.

According to various embodiments of the disclosure, the electronic device 200 may include a display 210 (e.g., the display device 160 in FIG. 1) to display information.

Referring to FIG. 2, the display 210 of the electronic device 200 may be disposed in the electronic device 200 to display information in the +Z direction.

According to various embodiments of the disclosure, a proximity sensor 230 may be disposed under the display 210. Being disposed under the display 210 may indicate being disposed in the −Z direction for the display 210 with reference to FIG. 2. The proximity sensor 230 may be disposed in an upper part of the electronic device 200 as illustrated in FIG. 2. In addition, the proximity sensor 230 may also be disposed at various positions in the electronic device 200. For example, the proximity sensor 230 may be disposed under the display 210 in a lower part of the electronic device 200.

According to various embodiments of the disclosure, the proximity sensor 230 may include a light emitter 231 which is an element capable of generating light and a light receiver 233 which is an element capable of receiving light. The light generated by the light emitter 231 of the proximity sensor 230 may pass through the display 210 disposed above the proximity sensor 230 and then be transferred to a subject. The light reflected by the subject may pass through the display 210 and then be transferred to the light receiver 233 of the proximity sensor 230. The proximity sensor 230 may compare the generated light and the reflected light to generate a sensor signal. For example, the proximity sensor 230 may identify whether a subject is close to the electronic device 200. The light generated by the light emitter 231 of the proximity sensor 230 may be light having various wavelengths. For example, the proximity sensor 230 may generate light having an infrared wavelength longer than that of visible rays.

According to various embodiments of the disclosure, the proximity sensor 230 may include at least one light emitter 231 to generate light. The proximity sensor 230 may include a single light emitter 231 or multiple light emitters 231. For example, the proximity sensor 230 may include three light emitters 231 as illustrated in FIG. 2. The three light emitters 231 included in the proximity sensor 230 may be a first light emitter 231-1, a second light emitter 231-2, and a third light emitter 231-3. In another embodiment of the disclosure, the electronic device 200 may include multiple proximity sensors 230 each including a single light emitter 231. According to various embodiments of the disclosure, the light receiver 233 of the proximity sensor 230 may receive light reflected by a subject. FIG. 2 illustrates one light receiver 233, but the number of the light receivers 233 may be variously changed.

According to various embodiments of the disclosure, a printed circuit board 240 electrically connecting various electronic components of the electronic device 200 may be disposed in a housing 250 of the electronic device 200. The display 210 and the proximity sensor 230 of the electronic device 200 may be electrically connected to the printed circuit board 240 of the electronic device 200.

Figure 3:
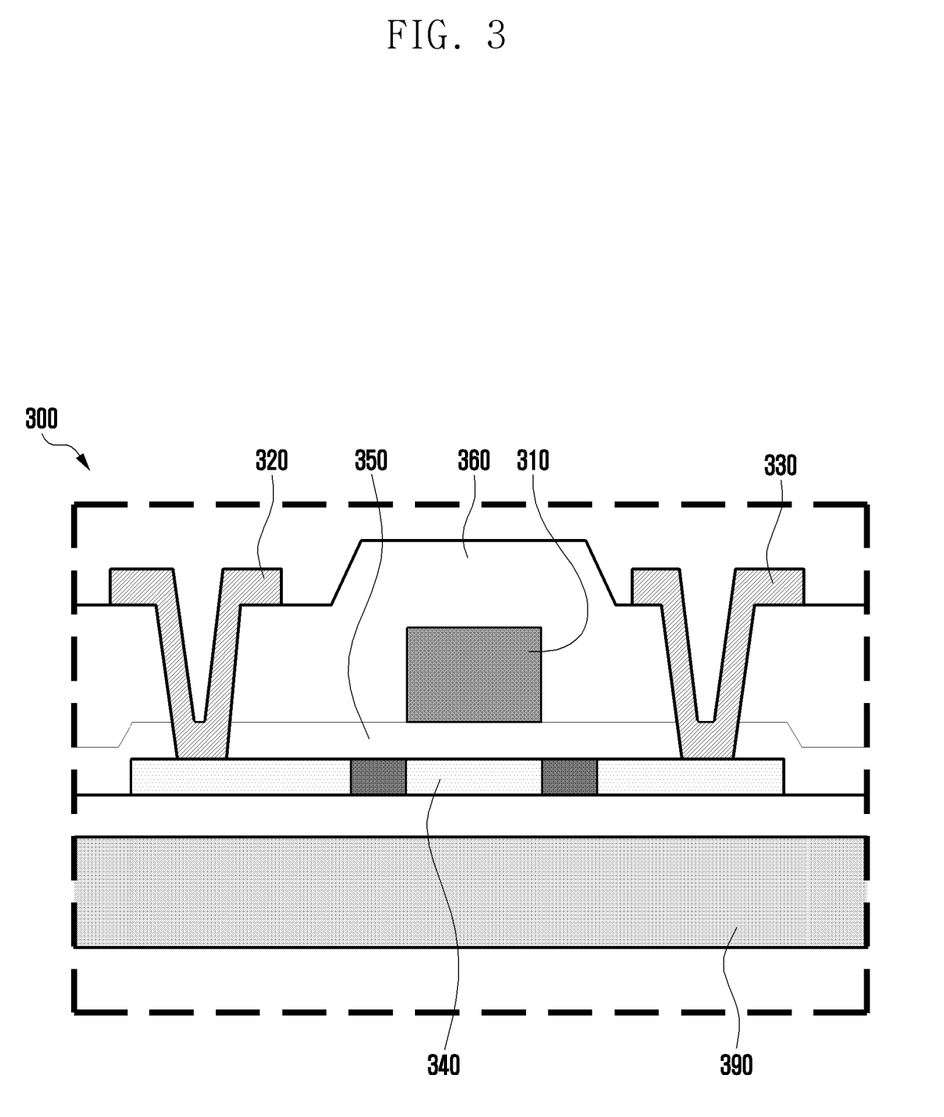
FIG. 3 is a cross-sectional view of a thin film transistor (TFT) included in a display according to an embodiment of the disclosure.

FIG. 3 is a cross-sectional view of a TFT included in a display according to an embodiment of the disclosure. The elements identical or similar to the elements described above will be described using the same reference signs.

Referring to FIG. 3, according to various embodiments of the disclosure, the display 210 of the electronic device 200 may include a thin film transistor (TFT) 300 illustrated in FIG. 3. The display 210 may include multiple pixels. Each pixel may include a light emitting element 450 (e.g., organic light emitting diode (OLED)) which generates light and at least one TFT 300. The TFT 300 may turn on or off the light emitting element 450 according to a control signal of the display 210, and adjust the strength of the light generated by the light emitting element 450. The TFT 300 may be formed by being deposited on a substrate 390 made of a glass material in various schemes. The TFT 300 illustrated in FIG. 3 merely corresponds to an example, and a TFT having various structures other than the TFT 300 illustrated in FIG. 3 may be included in the display 210 included in the electronic device 200 of the disclosure.

According to various embodiments of the disclosure, the TFT 300 may be a low temperature polycrystalline silicon (LDPS) TFT 300. The LDPS TFT 300 may have the features of a fast response speed and a high stability.

Referring to FIG. 3, the TFT 300 may include a source electrode 320, a drain electrode 330, a gate electrode 310, an active layer 340, a first insulator 350, and a second insulator 360. The active layer 340 may be converted into a conductive or non-conductive state according to an electrical signal applied to the gate electrode 310. In case that the active layer 340 is in a conductive state, an electrical signal applied from the source electrode 320 may be moved to the drain electrode 330 through the active layer 340. On the contrary, in case that the active layer 340 is in a non-conductive state, an electrical signal applied from the source electrode 320 may fail to pass through the active layer 340. The first insulator 350 may be disposed to be able to insulate the active layer 340. The second insulator 360 may be disposed to be able to entirely insulate the TFT 300. The gate electrode 310 may be electrically connected to a scan line (e.g., a scan line 410 in FIG. 4) described later, the source electrode 320 may be electrically connected to a data line (e.g., a data line 420 in FIG. 4) described later, and the drain electrode 330 may be connected to a light emitting element (e.g., the light emitting element 450 in FIG. 4). An electrical signal applied from the data line 420 to the source electrode 320 may be transferred or may not be transferred to the light emitting element 450 through the drain electrode 330 by an electrical signal applied to the gate electrode 310 through the scan line 410.

According to various embodiments of the disclosure, the light emitter 231 of the proximity sensor 230 may be disposed under the display 210. The light generated by the light emitter 231 of the proximity sensor 230 may be transferred to the TFT 300 included in the display 210. The light generated by the light emitter 231 may be transferred to the TFT 300 through the substrate 390 of the TFT 300. The light transferred to the TFT 300 may affect the active layer 340 of the TFT 300 in particular.

According to various embodiments of the disclosure, the active layer 340 may be mainly made of doped silicon. When the light generated by the light emitter 231 of the proximity sensor 230 has an energy larger than the work function of silicon, the photoelectric effect may occur in the active layer 340. As described above, the gate electrode 310 may convert the active layer 340 into a conductive or non-conductive state. In case that the light generated by the light emitter 231 of the proximity sensor 230 affects the active layer 340, the conversion of the active layer 340 by the gate electrode 310 may be unintentionally incurred. For example, the light generated by the light emitter 231 of the proximity sensor 230 may convert the active layer 340 from a non-conductive state into a conductive state. The source electrode 320 and the drain electrode 330 may be electrically connected to allow light generation of the light emitting element 450 connected to the drain electrode 330.

The proximity sensor 230 according to various embodiments disclosed herein may generate light having an energy lower than the work function of silicon. To this end, the wavelength of the light generated by the proximity sensor 230 may be adjusted. In case that the energy of the light generated by the proximity sensor 230 is smaller than the work function of silicon, the photoelectric effect which may occur in the active layer 340 of the TFT 300 may be suppressed. Therefore, an unintended operation of the display 210 may be minimized.

The proximity sensor 230 according to various embodiments disclosed herein may include multiple light emitters 231 as illustrated in FIG. 2. Each of the light emitter 231 may generate light having an energy lower than the work function of silicon. In addition, the proximity sensor 230 may generate an amount of light allowing generation of a sensor signal through the multiple light emitters 231. The photoelectric effect occurs in case that the energy of a photon is greater than the work function of a metal which the photon reaches. Therefore, even when the number of photons is increased (the amount of light is increased), in case that the energy of the photon is lower than the work function of a metal, the photoelectric effect does not occur. As described above, when the multiple light emitters 231 are used, it is possible to suppress the photoelectric effect of silicon and secure an amount of light allowing generation of a sensor signal.

Figure 4:
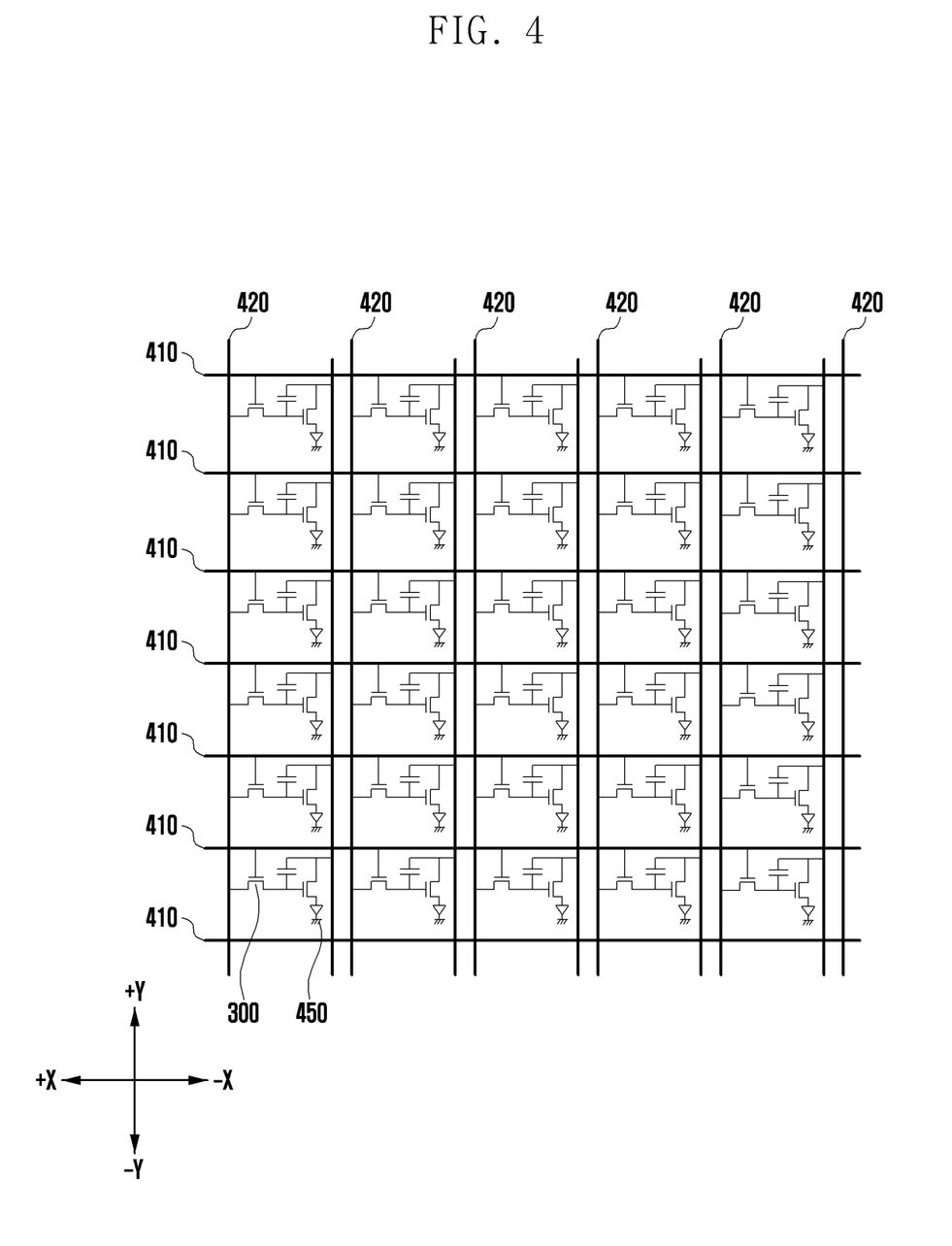
FIG. 4 is a wiring diagram of a display according to an embodiment of the disclosure.

FIG. 4 is a wiring diagram of a display according to an embodiment of the disclosure. FIG. 4 illustrates a total of 30 pixels, five pixels by six pixels for convenience of explanation, but more number of pixels may be included in the display 210.

Figure 5A:
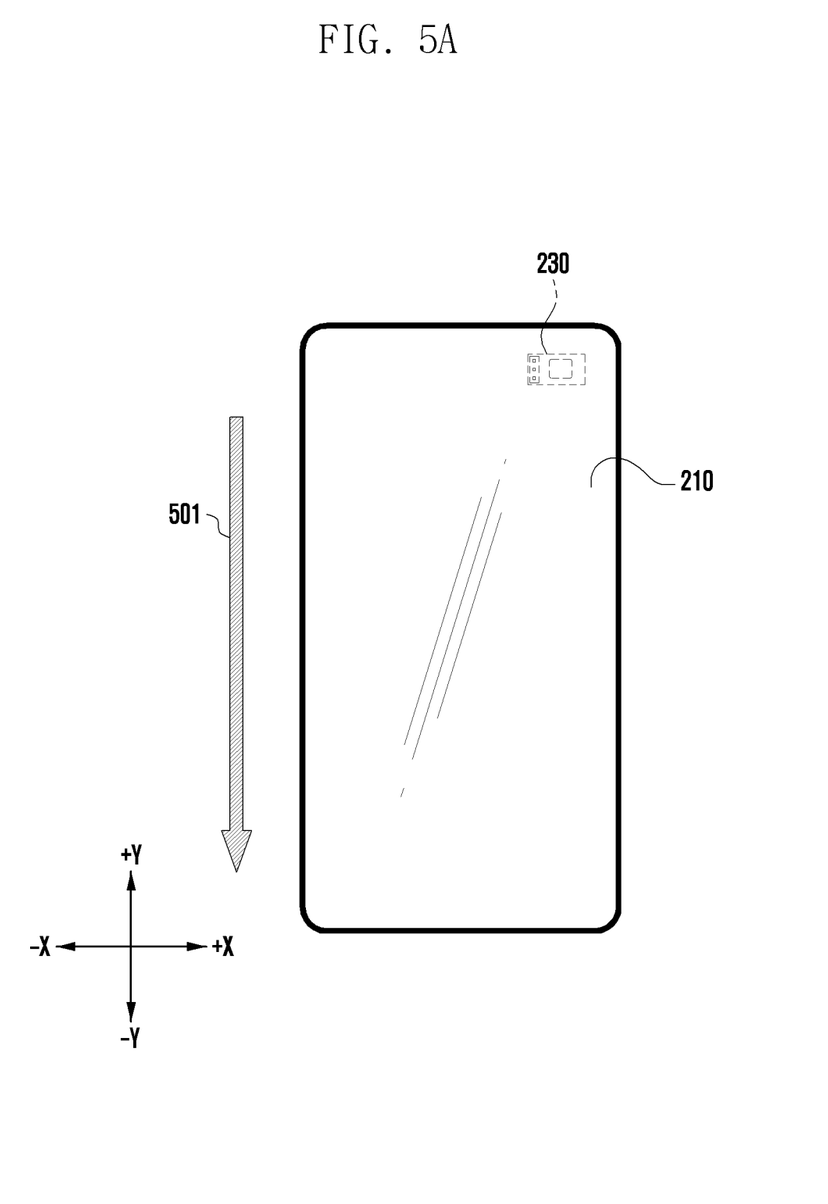
FIGS. 5A, 5B, and 6 are diagrams illustrating a method for operating a proximity sensor according to various embodiments of the disclosure.
Figure 5B:
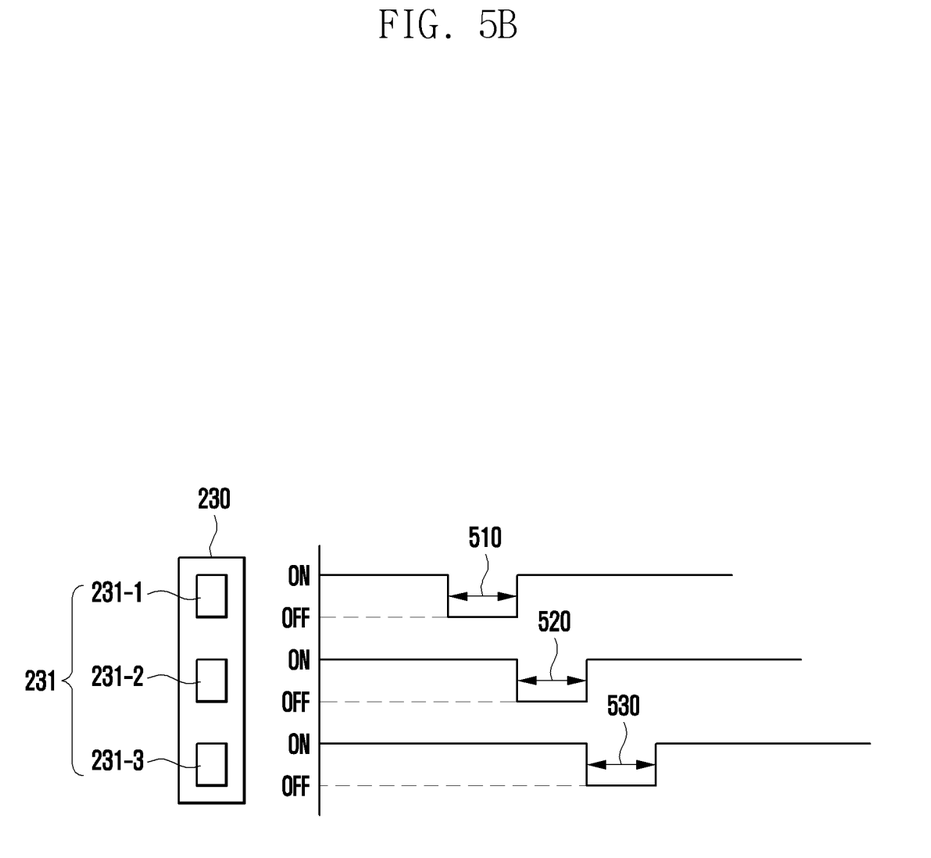
Figure 6:
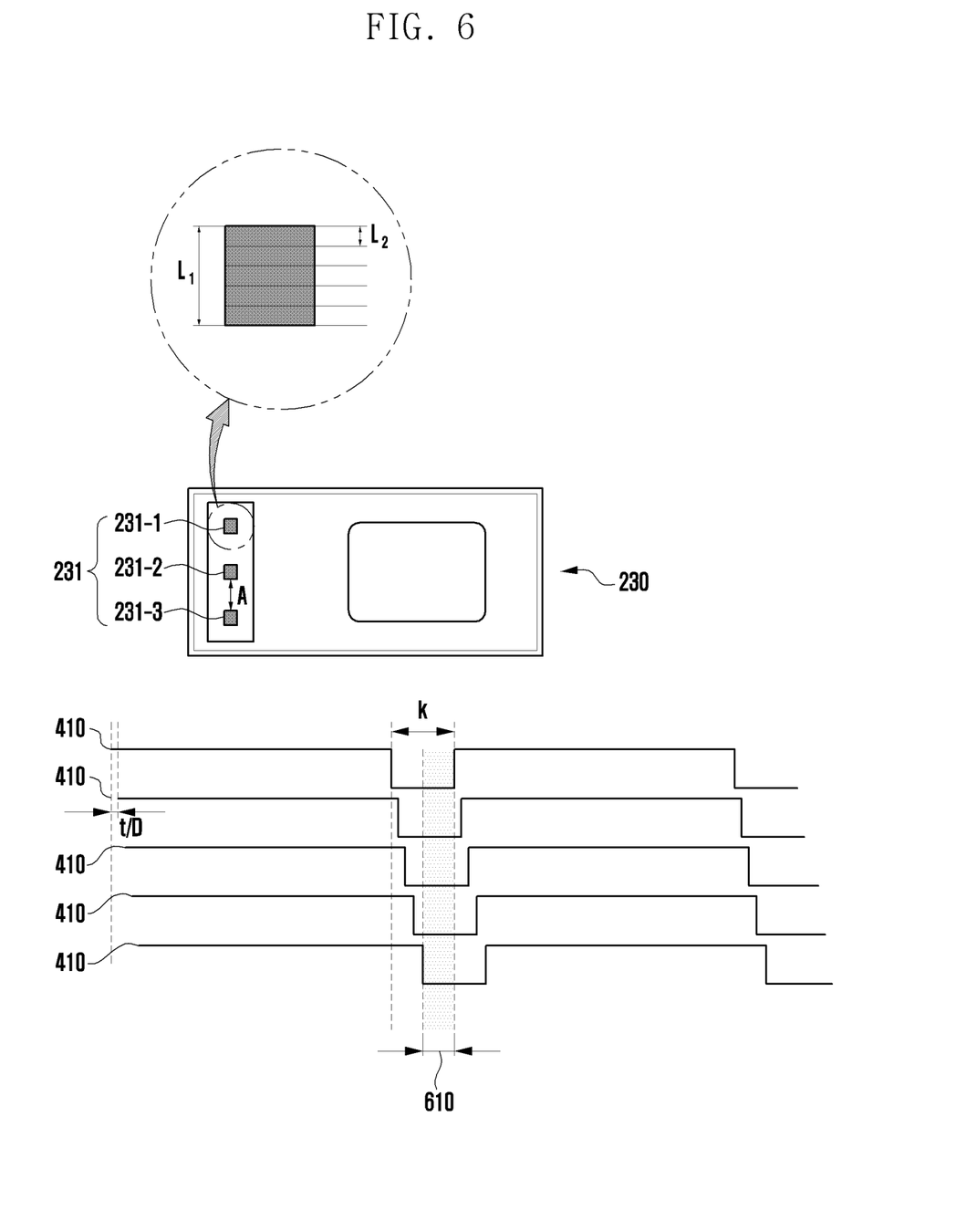

FIGS. 5A, 5B, and 6 are diagrams illustrating a method for operating a proximity sensor according to various embodiments of the disclosure. The elements identical or similar to the elements described above will be described using the same reference signs.

Referring to FIGS. 4, 5A, 5B, and 6, according to various embodiments of the disclosure, the display 210 may include multiple pixels. Each pixel may include at least one light emitting element 450 and at least one TFT 300. The multiple pixels may be connected to data lines 420 arranged in the transverse direction (e.g., the X-axis direction in FIG. 4) of the display 210, respectively. The multiple pixels may be connected to scan lines 410 arranged in the longitudinal direction (e.g., the Y-axis direction in FIG. 4) of the display 210, respectively.

According to various embodiments of the disclosure, the gate electrode 310 of the TFT 300 included in each pixel may be electrically connected to the scan line 410. The source electrode 320 of the TFT 300 included in each pixel may be electrically connected to the data line 420.

According to various embodiments of the disclosure, the display 210 may operate in a type of flickering very fast. Due to the physical distance difference between the multiple scan lines 410 from a controller (e.g., a scan driver ID) providing an electrical signal to each of the scan lines 410, electrical signals applied to the respective scan lines 410 may have a time difference. For example, with reference to FIG. 4, an electrical signal may first reach the scan line 410 disposed in the +Y direction, and then electrical signals sequentially reach the scan lines 410 arranged in the −Y direction. A time taken for the display 210 to flicker one time may be a time taken from the arrival of an electric signal at the uppermost scan line 410 to the arrival of an electric signal at the lowermost scan line 410. In a case of the display 210 having a scan rate of 60 Hz, the time may be 1/60 seconds. In case that no electrical signal is applied to the scan line 410, the pixels of the line may be turned off. The display 210 having a scan rate of 60 Hz may be turned on from the top to the bottom for 1/60 seconds.

According to various embodiments of the disclosure, a processor of the electronic device 200 may control the proximity sensor 230 so that the proximity sensor 230 generates light in a state where an area of the display 210, which faces the proximity sensor 230, has been turned off. The area of the display 210 may indicate an area configured by at least one pixel. The processor may control the proximity sensor 230 to allow light to be generated in the proximity sensor 230, when a pixel of the display 210, which faces the proximity sensor 230, is turned off. In case that the pixel is turned off, even when the light generated in the proximity sensor 230 causes the photoelectric effect in the active layer 340 of the TFT 300, the light emitting element 450 may not emit light. A state where the pixel is turned off corresponds to a state where an electrical path is disconnected, and thus the photoelectric effect may not cause light generation in the light emitting element 450. The processor may operate the at least one light emitter 231 in conjunction with an operation of the display 210. For example, the processor may operate the at least one light emitter 231 in conjunction with an electrical signal applied to the scan line 410. As described above, the electrical signal applied to the scan line 410 may sequentially reach the scan lines 410 in the arrangement direction of the scan lines 410. Before the electrical signal reaches the scan line 410, the pixels connected to the scan line 410 may be maintained in an OFF state. When an electrical signal does not reach the scan line 410 connected to a pixel facing the proximity sensor 230, the processor may operate the light emitter 231 of the proximity sensor 230.

According to various embodiments of the disclosure, referring to FIGS. 5A and 5B, the multiple light emitters 231 of the proximity sensor 230 may be arranged in the arrangement direction of the scan line 410. For example, the light emitters 231 may be arranged in the Y-axis direction in FIG. 5A. As described above, electrical signals may be applied to the longitudinally arranged scan lines 410 in the sequence following an arrow direction 501 illustrated in FIG. 5A. The multiple light emitters 231 of the proximity sensor 230 may generate light in conjunction with the electrical signals.

Diagram in FIG. 5B illustrates electrical signals applied to the scan lines 410 connected to pixels of the display 210, which face the multiple light emitters 231 (the first light emitter 231-1, the second light emitter 231-2, and the third light emitter 231-3) of the proximity sensor 230. The first light emitter 231-1 may generate light in a state 510 in which an electrical signal has not reached the scan line 410 connected to a pixel facing the first light emitter 231-1. Next, the second light emitter 231-2 may generate light in a state 520 in which an electrical signal has not reached the scan line 410 connected to a pixel facing the second light emitter 231-2. Next, the third light emitter 231-3 may generate light in a state 530 in which an electrical signal has not reached the scan line 410 connected to a pixel facing the third light emitter 231-3. As described above, electrical signals may reach the scan lines 410 from an upper end of the electronic device 200 to a lower end. The first light emitter 231-1, the second light emitter 231-2, and the third light emitter 231-3 may be arranged in that order from the upper end of the electronic device 200, and thus light may be generated in the order of the first light emitter 231-1, the second light emitter 231-2, and the third light emitter 231-3.

According to various embodiments of the disclosure, one light emitter 231 may face several pixels. For example, the light emitter 231 may face five pixels in the arrangement direction of the light emitters 231. The five pixels may be connected to five scan lines 410 arranged in the longitudinal direction (e.g., the Y-axis direction in FIG. 6), respectively. The light emitter 231 may generate light while the five pixels are all turned off. For example, the light emitter 231 may generate light for an interval 610 illustrated in FIG. 6.

According to various embodiments of the disclosure, a time ($T_1$, 610) for which one light emitter 231 generates light may be determined by Equation 1 as below.

$$T_1 = K - \{(L_1/L_2 - 1) X (t/D)\} \qquad \text{Equation 1}$$

Here, $L_1$ is the longitudinal length of the light emitter 231, and $L_2$ is the longitudinal length of the pixel. Therefore, $L_1/L_2$ is the number of pixels facing the light emitter 231. In addition, t is a time taken for electrical signals to reach scan lines from the uppermost scan line 410 to the lowermost scan line 410, and D is the number of pixels arranged in the longitudinal direction of the display 210. Therefore, t/D denotes the difference between the times taken for electrical signals to reach the adjacent scan lines 410. K indicates a time for which a state where an electrical signal has not reached the scan line 410 is maintained.

When the number of light emitters 231 is n, the proximity sensor 230 may generate light for an $nT_1$ time.

According to various embodiments of the disclosure, the processor may control the light emitters 231 of the proximity sensor 230 to generate light in a state where a pixel facing a part between the light emitters 231 is turned off A light-emittable time ($T_2$) for the part between the light emitters 231 may be determined by Equation 2 as below.

$$T_2 = (A/L_2) X (t/D) \qquad \text{Equation 2}$$

A denotes the longitudinal length of a space between the light emitters 231, and $L_2$ is the longitudinal length of a pixel. Therefore, $A/L_2$ is the number of pixels facing the space between the light emitters 231. In addition, t is a time taken for electrical signals to reach scan lines from the uppermost scan line 410 to the lowermost scan line 410, and D is the number of pixels arranged in the longitudinal direction of the display 210. Therefore, t/D denotes the difference between the times taken for electrical signals to reach the adjacent scan lines 410. When the number of light emitters 231 is n, the number of the spaces between the light emitters 231 is n−1, and thus the proximity sensor 230 may generate light for a $(n-1)T_2$ time.

According to various embodiments of the disclosure, a total time (T) for which light is emittable by the proximity sensor 230 may be determined to be the sum of $T_1$ and $T_2$ described above.

An electronic device according to various embodiments disclosed herein may include a display including multiple thin film transistors (TFTs), a proximity sensor disposed under the display and including multiple light emitters, and a processor operatively connected to the display and the proximity sensor, wherein light generated by the proximity sensor may have an energy lower than a work function of silicon included in the multiple TFTs of the display.

In addition, light generated by the multiple light emitters of the proximity sensor may have an energy lower than a work function of silicon included in the multiple TFTs of the display.

In addition, the processor may be configured to control the proximity sensor to allow the proximity sensor to generate light in a state where at least a partial area of the display, which the proximity sensor faces, is turned off.

In addition, the processor may be configured to, when at least a partial area of the display, which the proximity sensor faces, is turned off, control the proximity sensor to allow light to be generated by a light emitter, among the multiple light emitters of the proximity sensor, which faces the turned-off area.

In addition, the display may include multiple scan lines and multiple data lines crossing each other, and the multiple light emitters of the proximity sensor may be arranged in an arrangement direction of the multiple scan lines of the display.

In addition, the multiple light emitters of the proximity sensor may be arranged in a line.

In addition, the multiple scan lines of the display may be connected to gate electrodes included in the respective multiple TFTs, respectively.

In addition, the processor may be configured to operate at least one of the multiple light emitters of the proximity sensor in conjunction with an operation of the display.

In addition, the processor may be configured to operate at least one of the multiple light emitters of the proximity sensor in conjunction with electrical signals applied to the multiple scan lines of the display.

In addition, the multiple light emitters of the proximity sensor may include a first light emitter, a second light emitter, and a third light emitter, wherein the processor may be configured to, when at least a partial area of the display, which faces the first light emitter, is turned off according to electrical signals applied to the multiple scan lines of the display, control the first light emitter to generate light, when at least a partial area of the display, which faces the second light emitter, is turned off, control the second light emitter to generate light, and when at least a partial area of the display, which faces the third light emitter, is turned off, control the third light emitter to generate light.

In a method for operating a proximity sensor included in an electronic device according to various embodiments disclosed herein, the proximity sensor may be disposed under a display of the electronic device, and may include multiple light emitters, and the multiple light emitters of the proximity sensor may operate in a state where at least a partial area of the display, which faces the proximity sensor, is turned off.

In addition, light generated by the multiple light emitters of the proximity sensor may have an energy lower than a work function of silicon of a TFT included in the display.

In addition, at least one of the multiple light emitters of the proximity sensor may operate in conjunction with an operation of the display.

In addition, at least one of the multiple light emitters of the proximity sensor may operate in conjunction with electrical signals applied to multiple scan lines of the display.

In addition, the multiple light emitters of the proximity sensor may include a first light emitter, a second light emitter, and a third light emitter, wherein the first light emitter may generate light when at least a partial area of the display, which faces the first light emitter, is turned off according to electrical signals applied to multiple scan lines of the display, wherein the second light emitter may generate light when at least a partial area of the display, which faces the second light emitter, is turned off, and wherein the third light emitter may generate light when at least a partial area of the display, which faces the third light emitter, is turned off.

While the disclosure has been shown and described with reference to various embodiments thereof, it will be understood by those skilled in the art that various changes in form and details may be made therein without departing from the spirit and scope of the disclosure as defined by the appended claims and their equivalents.

What is claimed is:

1. An electronic device comprising:
   a display including multiple thin film transistors (TFTs) and multiple scan lines arranged in a first direction;
   a proximity sensor disposed under the display and including multiple light emitters arranged in the first direction; and
   at least one processor operatively connected to the display and the proximity sensor,
   wherein light generated by the proximity sensor has an energy lower than a work function of silicon included in the multiple TFTs of the display.

2. The electronic device of claim 1, wherein light generated by the multiple light emitters of the proximity sensor has an energy lower than a work function of silicon included in the multiple TFTs of the display.

3. The electronic device of claim 1, wherein the at least one processor is configured to control the proximity sensor to allow the proximity sensor to generate light in a state where at least a partial area of the display, which the proximity sensor faces, is turned off.

4. The electronic device of claim 3, wherein the at least one processor is configured to, in case that at least a partial area of the display, which the proximity sensor faces, is turned off, control the proximity sensor to allow light to be generated by a light emitter, among the multiple light emitters of the proximity sensor, which faces the turned-off area.

5. The electronic device of claim 1, wherein the multiple light emitters of the proximity sensor are arranged in a line.

6. The electronic device of claim 1, wherein the multiple scan lines of the display are connected to gate electrodes included in the respective multiple TFTs, respectively.

7. The electronic device of claim 1, wherein the at least one processor is configured to operate at least one of the multiple light emitters of the proximity sensor in conjunction with an operation of the display.

8. The electronic device of claim 1, wherein the at least one processor is configured to operate at least one of the multiple light emitters of the proximity sensor in conjunction with electrical signals applied to the multiple scan lines of the display.

9. The electronic device of claim 1,
   wherein the multiple light emitters of the proximity sensor comprise a first light emitter, a second light emitter, and a third light emitter, and
   wherein the at least one processor is configured to:
      in case that at least a partial area of the display, which faces the first light emitter, is turned off according to electrical signals applied to the multiple scan lines of the display, control the first light emitter to generate light,
      in case that at least a partial area of the display, which faces the second light emitter, is turned off, control the second light emitter to generate light, and in case that at least a partial area of the display, which faces the third light emitter, is turned off, control the third light emitter to generate light.

10. A method for operating a proximity sensor included in an electronic device having a display comprising multiple scan lines arranged in a first direction, the method comprising:
- disposing the proximity sensor under a display of the electronic device, wherein the proximity sensor comprises multiple light emitters arranged in the first direction; and
- operating the multiple light emitters of the proximity sensor in a state where at least a partial area of the display, which faces the proximity sensor, is turned off.

11. The method of claim 10, wherein light generated by the multiple light emitters of the proximity sensor has an energy lower than a work function of silicon of a TFT included in the display.

12. The method of claim 10, wherein at least one of the multiple light emitters of the proximity sensor operates in conjunction with an operation of the display.

13. The method of claim 10, wherein at least one of the multiple light emitters of the proximity sensor operates in conjunction with electrical signals applied to multiple scan lines of the display.

14. The method of claim 10,
- wherein the multiple light emitters of the proximity sensor comprise a first light emitter, a second light emitter, and a third light emitter,
- wherein the first light emitter generates light in case that at least a partial area of the display, which faces the first light emitter, is turned off according to electrical signals applied to multiple scan lines of the display,
- wherein the second light emitter generates light in case that at least a partial area of the display, which faces the second light emitter, is turned off, and
- wherein the third light emitter generates light in case that at least a partial area of the display, which faces the third light emitter, is turned off.

* * * * *